(12) United States Patent
Shiraishi et al.

(10) Patent No.: US 7,834,438 B2
(45) Date of Patent: Nov. 16, 2010

(54) SEALED STRUCTURE AND METHOD OF FABRICATING SEALED STRUCTURE AND SEMICONDUCTOR DEVICE AND METHOD OF FABRICATING SEMICONDUCTOR DEVICE

(75) Inventors: Akinori Shiraishi, Nagano (JP); Naoyuki Koizumi, Nagano (JP); Kei Murayama, Nagano (JP); Hideaki Sakaguchi, Nagano (JP); Masahiro Sunohara, Nagano (JP); Yuichi Taguchi, Nagano (JP); Mitsutoshi Higashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 683 days.

(21) Appl. No.: 11/624,440

(22) Filed: Jan. 18, 2007

(65) Prior Publication Data
US 2007/0177360 A1 Aug. 2, 2007

(30) Foreign Application Priority Data
Jan. 27, 2006 (JP) ............................. 2006-019286

(51) Int. Cl.
H01L 23/06 (2006.01)
(52) U.S. Cl. .................... 257/684; 257/685; 438/51
(58) Field of Classification Search .................. 257/684, 257/685; 438/51
See application file for complete search history.

(56) References Cited

U.S. PATENT DOCUMENTS

| 6,144,153 A * | 11/2000 | Nakatani | 313/495 |
| 6,172,456 B1 * | 1/2001 | Cathey et al. | 313/495 |
| 2004/0189185 A1 * | 9/2004 | Yotsuya | 313/501 |
| 2008/0128839 A1 | 6/2008 | Sotokawa | |

FOREIGN PATENT DOCUMENTS

| JP | 2005-166909 | | 6/2005 |
| JP | 2005166909 A | * | 6/2005 |

* cited by examiner

*Primary Examiner*—Thanh V Pham
*Assistant Examiner*—Marvin Payen
(74) *Attorney, Agent, or Firm*—Rankin, Hill & Clark LLP

(57) ABSTRACT

According to a sealed structure 60 constituted by anodically bonding a silicon board 20 and a glass plate 40, an upper opening of a recessed portion 22 is sealed in an airtight state by the glass plate 40 by bonding an upper face of a wall portion 26 to the glass plate 40. A voltage applying pattern 70 is formed to surround a light transmitting region to which an optical conversion element 24 is opposed. Further, the voltage applying pattern 70 functions as a cathode pattern applied with a voltage by being brought into contact with a lower face of the cathode plate 50.

8 Claims, 11 Drawing Sheets

SEALED STRUCTURE AND METHOD OF FABRICATING SEALED STRUCTURE AND SEMICONDUCTOR DEVICE AND METHOD OF FABRICATING SEMICONDUCTOR DEVICE

BACKGROUND OF THE INVENTION

The present invention relates to a sealed structure having a structure of sealing an element on a silicon board by a glass plate, and a method of fabricating a sealed structure, and a semiconductor device, and a method of fabricating a semiconductor device.

Although there are present various kinds of elements formed on a board, or mounted on a board, depending on the kinds of the elements, there is a case in which it is preferable that the elements are used in a state of being sealed on the board.

For example, an element using a microelectromechanical system (there is a case of being referred to as 'MEMS') (referred to as 'MEMS element' as follows) is a representative element which is preferably used by being sealed on a board in view of a structure thereof.

As such an MEMS element, there is an optical functioning element of, for example, a pressure sensor, an acceleration sensor, a digital micromirror device or the like. It is preferable to use such an MEMS element in a vacuum state, a reduced pressure state, or an atmosphere replaced by an inert gas, it is preferable to use the element by being sealed in airtight. Therefore, a method of sealing an MEMS element is proposed (refer to, for example, Patent Reference 1).

According to a semiconductor device described in Patent Reference 1, there is used a sealed structure constituted by bonding a board and a support plate by anodic bonding in a state of mounting a support plate (glass) having a recessed portion on a silicon board mounted with an element and covering the element by the recessed portion.

[Patent Reference 1] JP-A-2005-166909

However, according to the semiconductor device of the background art, in the anodic bonding, by applying a high voltage in a state of bringing an anode into contact with a lower face (back face) of the silicon board and bringing a cathode into contact with an upper face of the support plate, there poses a problem that in a procedure of softening glass including movable ions by heating the silicon board and simultaneously bonding the silicon board and the glass by an electrostatic attraction force, an impurity (sodium ($Na^+$)) included in glass is precipitated on a side of the cathode of a glass face.

When an opaque layer by sodium is formed on the glass face in this way, for example, in a case of containing an element for receiving or emitting light such as an optical functioning element in a sealed space, there is a concern of reducing transmittance of light. Further, sodium is difficult to be removed from the glass surface since sodium is provided with an adherence, and therefore, it is difficult to recover the transmittance of glass even when the glass is cleaned or the like.

Hence, in view of the above-described situation, it is an object of the invention to provide a sealed structure, and a method of fabricating a sealed structure, and a semiconductor device, and a method of fabricating a semiconductor device resolving the problem by preventing an impurity from being precipitated on a glass surface.

SUMMARY OF THE INVENTION

In order to resolve the above-described problem, the invention includes the following means.

There is provided a sealed structure including:

a silicon board, a glass plate to be anodically bonded to the silicon board, an anode plate in contact with the silicon board, a cathode plate in contact with the glass plate, wherein a recessed portion is provided at either the silicon board or the glass plate to be sealed, a voltage applying pattern along a bonding region surrounding a nonbonding region to which the recessed portion is opposed is formed between the glass plate and the cathode plate, and a wall portion surrounding the recessed portion is anodically bonded to the glass plate or the silicon board by applying a high voltage to the voltage applying pattern.

Further, there is provided a method for fabricating a sealed structure including a recessed portion at either a silicon board or a glass plate to be bonded to the silicon board, an anode plate in contact with the silicon board, a cathode plate in contact with the glass plate, the silicon board and the glass plate being anodically bonded to seal the recessed portion, the method including:

a step of forming a voltage applying pattern along a bonding region surrounding a nonbonding region to which the recessed portion is opposed between the glass plate and the cathode plate, a step of closing the recessed portion by mounting the glass plate onto the silicon board, and a step of anodically bonding a wall portion surrounding the recessed portion to the glass plate or the silicon board by applying a high voltage to the voltage applying pattern.

It is preferable that the voltage applying pattern is formed by a metal thin film constituted by laminating a conductive metal on the glass plate by a predetermined height.

Further, it is preferable that the voltage applying pattern is formed with a conductive metal layer having a uniform thickness on the same plane at the glass plate, and formed with a through hole at a region of the conductive metal layer opposed to the recessed portion.

Further, it is preferable that the voltage applying pattern is provided with a noncontact portion at a region of a surface of the cathode plate opposed to the nonbonding region.

Further, there is provided a semiconductor device, including:

a recessed portion provided at either a silicon board or a glass plate to be bonded to the silicon board, an element mounted at inside of the recessed portion, an anode plate in contact with the silicon board, a cathode plate in contact with the glass plate, wherein the silicon board and the glass plate are anodically bonded to seal the recessed portion, a voltage applying pattern along a region surrounding a light transmitting region to which the element is opposed is formed between the glass plate and the cathode plate, and a wall portion surrounding the recessed portion is anodically bonded to the glass plate or the silicon board by applying a high voltage to the voltage applying pattern.

Further, there is provided a method of fabricating a semiconductor device having a sealed structure for sealing a recessed portion by providing the recessed portion at either a silicon board or a glass plate to be bonded to the silicon board, an anode plate in contact with the silicon board, and a cathode plate in contact with the glass plate, the silicon board and the glass plate being anodically bonded to seal the recessed portion, the method including:

a step of mounting an element at inside of the recessed portion, a step of forming a voltage applying pattern along a region surrounding a light transmitting region to which the element is opposed between the glass plate and the cathode plate, a step of closing the recessed portion by mounting the glass plate onto the silicon board, and a step of anodically bonding a wall portion surrounding the recessed portion to the glass plate or the silicon board by applying a high voltage to the voltage applying pattern.

According to the invention, the voltage applying pattern along the region surrounding the surrounding of the nonbonding region to which the recessed portion provided at the silicon board or the glass plate to be bonded to the silicon board is opposed is formed, the wall portion surrounding the recessed portion is bonded to the glass plate or the silicon board by applying the high voltage to the voltage applying pattern, and therefore, although an impurity is precipitated only at the bonding portion of the glass plate, the impurity can be prevented from being precipitated at the nonbonding region to which the recessed portion is opposed. Therefore, for example, when the element mounted to the recessed portion receives light or emits light, a transmittance of the glass plate can be prevented from being reduced.

Further, according to the invention, the voltage applying pattern includes the metal thin film laminated with the conductive metal, the metal thin film is formed at the pattern along the region excluding the nonbonding region opposed to the recessed portion and therefore, a fine pattern can be formed by using a thin film forming method of a sputtering or vapor deposition method or the like.

Further, according to the invention, the voltage applying pattern is formed with the conductive metal layer on the same plane and formed with the through hole at the nonbonding region of the conductive metal layer opposed to the recessed portion, and therefore, the voltage applying pattern can easily be worked by plating and etching or the like.

Further, according to the invention, the voltage applying pattern is formed by providing the noncontact portion opposed to the recessed portion at the surface of the cathode brought into contact with the back face of the glass plate, and therefore, the step of forming the voltage applying pattern needs not to carry out at each time, and a production efficiency can be promoted by reducing a number of steps of anodic bonding.

DETAILED DESCRIPTION OF THE PREFERRED EMBODIMENTS

The best mode for carrying out the invention will be explained in reference to the drawings as follows.

Embodiment 1

Figure 1:
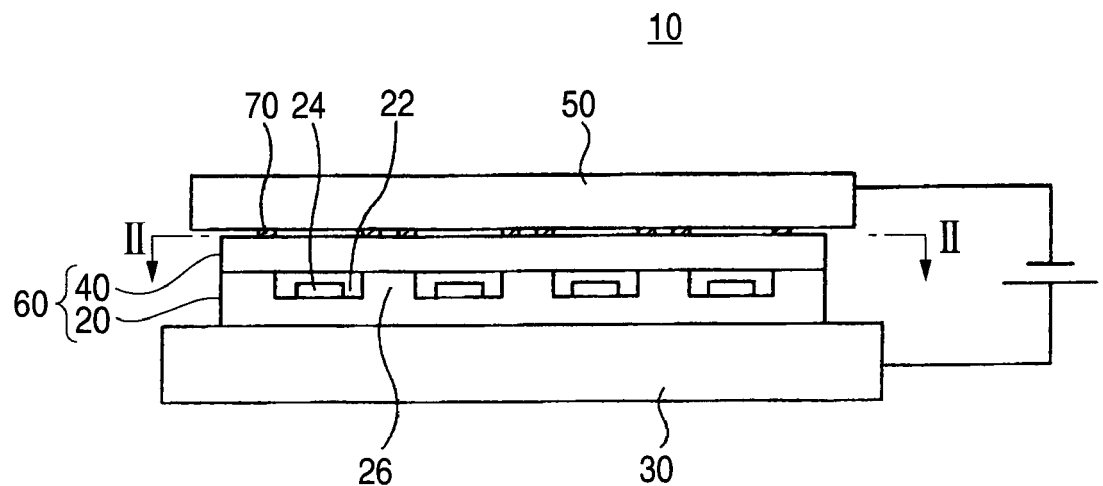
FIG. 1 is a vertical sectional view schematically showing an anodic bonding apparatus for bonding a sealed structure according to Embodiment 1 of the invention.
Figure 2:
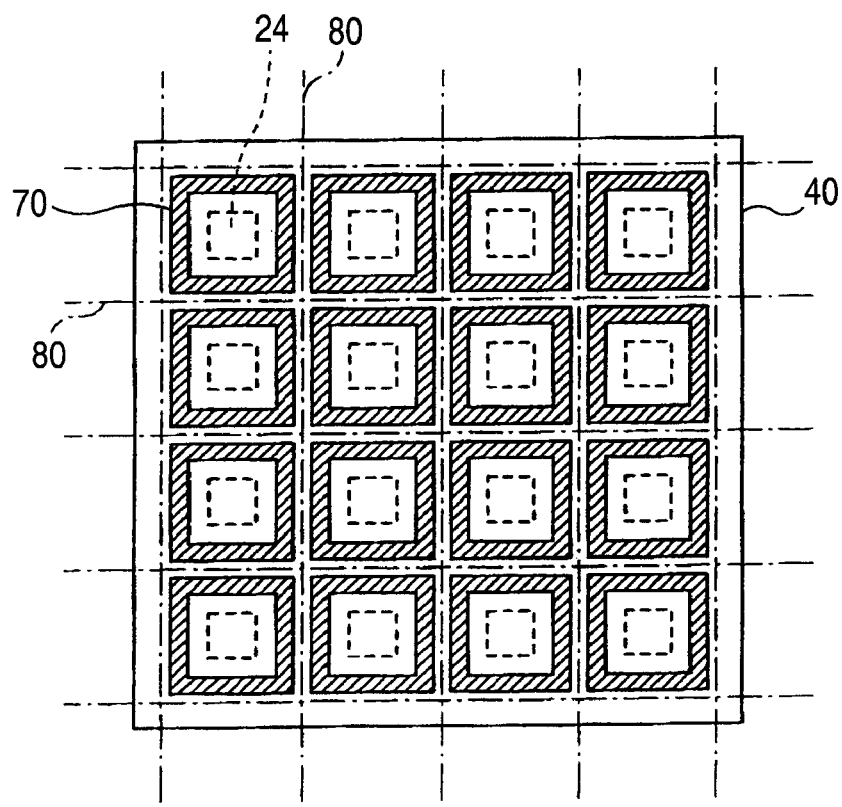
FIG. 2 is a cross-sectional view taken along a line II-II of FIG. 1.

FIG. 1 is a vertical sectional view schematically showing an anodic bonding apparatus for bonding a sealed structure according to Embodiment 1 of the invention. FIG. 2 is a cross-sectional view taken along a line II-II of FIG. 1. As shown by FIG. 1, an anodic bonding apparatus 10 is constituted to anodically bond an upper face of a silicon board 20 and a lower face of a glass plate 40 by applying a high voltage in a state of bringing an anode plate 30 into contact with a lower face of the silicon board 20 and bringing a cathode plate 50 into contact with an upper face of the transparent glass plate 40.

In this case, anodic bonding is carried out by applying the high voltage between the silicon board 20 and the glass plate 40 and elevating a temperature of the silicon board 20 and the glass plate 40 to, for example, about 300 through 350° C. Further, borosilicate glass added with boron having heat resistance is used for the glass plate 40 to thereby enable to excellently carry out thermally melting bonding by anodic bonding.

The upper face of the silicon board 20 is arranged with a plurality of recessed portions 22 at constant intervals, and an inner space of each recessed portion 22 is mounted with, for example, an optical conversion element 24 for receiving or emitting light. Therefore, the optical conversion element 24 is contained on an inner side of a wall portion 26 formed to surround a surrounding of the recessed portion 22. Further, according to a sealed structure 60 constituted by anodically bonding the silicon board 20 and the glass plate 40, by bonding the upper face of the wall portion 26 to the glass plate 40, an upper opening of the recessed portion 22 is sealed in an airtight state by the glass plate 40.

Further, the sealed structure 60 according to the embodiment is applicable also to a constitution of mounting an element other than the optical conversion element 24, for example, an MEMS element or the like, mentioned above.

Further, a voltage applying pattern 70 is formed between the upper face of the glass plate 40 and the cathode plate 50. As shown by FIG. 2, the voltage applying pattern 70 is formed in a shape of a square frame (a portion in FIG. 2 shown by hatching) along a region surrounding a surrounding of a nonbonding region to which the recessed portion 22 is opposed. Further, the voltage applying pattern 70 may be formed at the region excluding the nonbonding region to which the recessed portion 22 is opposed, and therefore, the voltage applying pattern 70 is not limited to the pattern as shown by FIG. 2 but there may be constituted a pattern of making the respective voltage applying patterns 70 independent respectively from each other, or there can be constituted a pattern of connecting the respective voltage applying patterns 70 partially or totally.

That is, the voltage applying pattern 70 is formed in the shape of the rectangular frame in correspondence with an upper face of the wall portion 26, and anodic bonding can efficiently be carried out between the upper face of the wall portion 26 and the glass plate 40. Further, the voltage applying pattern 70 is formed not to be disposed on an upper side of the optical conversion element 24 and is formed to surround a light transmitting region to which the optical conversion element 24 is opposed.

Further, the voltage applying pattern 70 functions as a cathode pattern for applying a voltage by being brought into contact with the lower face of the cathode plate 50. Therefore, according to the sealed structure 60, when a high voltage is applied to the voltage applying pattern 70, although an impurity (sodium) included in the glass plate 40 is precipitated to a cathode side (bonded portion) of the glass plate 40 at a bonding region opposed to the voltage applying pattern 70, the impurity (sodium) is prevented from being precipitated in the nonbonding region to which the recessed portion 22 is opposed.

Thereby, transmittance of the glass plate 40 is prevented from being reduced, and therefore, the sealed structure 60 is constituted such that transmission of light in receiving light or emitting light by the optical conversion element 24 is not hampered by the glass plate 40. Further, according to the sealed structure 60 of the embodiment, the silicon board 20 is formed with the plurality of the recessed portions 22, the plurality of recessed portions 22 are simultaneously sealed, and the sealed structure 60 is cut along a scribe line 80 indicated by a one-dotted chain line in FIG. 2 by a dicing step after finishing the anodic bonding.

Figure 3:
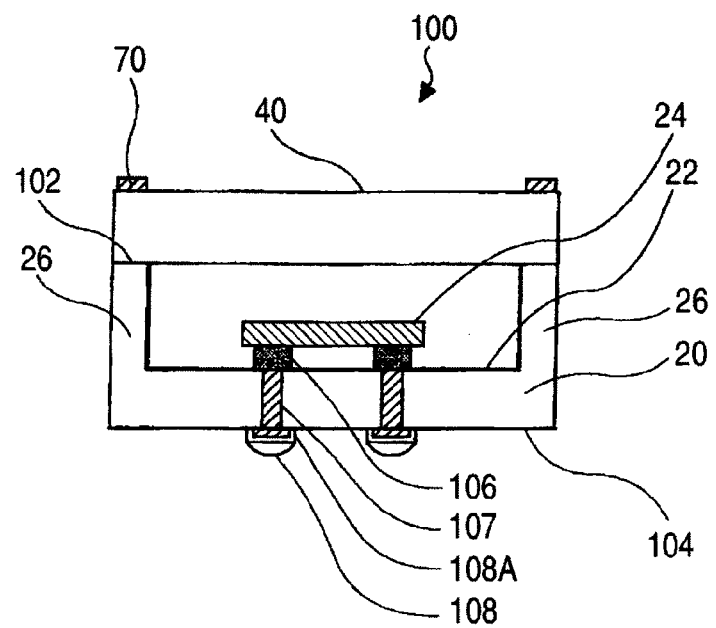
FIG. 3 is a view showing a semiconductor device having the sealed structure according to Embodiment 1.

Semiconductor devices 100 cut out from the sealed structure 60 anodically bonded in this way for the respective recessed portions 22 mounted with the individual optical conversion elements 24 are constituted as shown by FIG. 3. Here, a constitution of the semiconductor device 100 will be explained.

The semiconductor device 100 is constituted by including the silicon board 20 having the recessed portion 22, the optical conversion element 24 mounted to the recessed portion 22, and the glass plate 40 and sealing the recessed portion 22 by anodically bonding the upper face of the wall portion 26 surrounding the recessed portion 22 and the glass plate 40.

Further, a bonding layer 102 is constituted by a portion of bringing the upper face of the wall portion 26 and the lower face of the glass plate 40 into contact with each other.

Further, the optical conversion element 24 is installed on a bump (Au bump) 106 including, for example, Au, and the optical conversion element 24 is electrically connected to a via plug (penetrated wiring) 107 formed to penetrate a bottom face of the silicon board 20 by way of the bump 106.

A connecting layer 108A including, for example, Ni/Au plated layer is formed on a side of the via plug 107 opposed to a side of being connected with the optical conversion element 24, further, a solder bump 108 is formed at the connecting layer 108A. Further, the connecting layer 108A is laminated with a Ni layer and an Au layer such that the Au layer is formed on a lower face side bonded with the solder bump 108.

Further, a surface of the silicon board 20 is formed with an oxide film (silicon oxide film) 104 to thereby insulate, for example, between the silicon board 20 and the via plug 107 and between the silicon board 20 and the bump 106.

Next, an explanation will be given of an example of a fabricating method of fabricating the semiconductor device 100 in reference to FIG. 4A through FIG. 4L by following a procedure. However, there is a case in which in the following drawings, portions explained above are attached with the same reference notations and an explanation thereof is omitted.

Figure 4A:
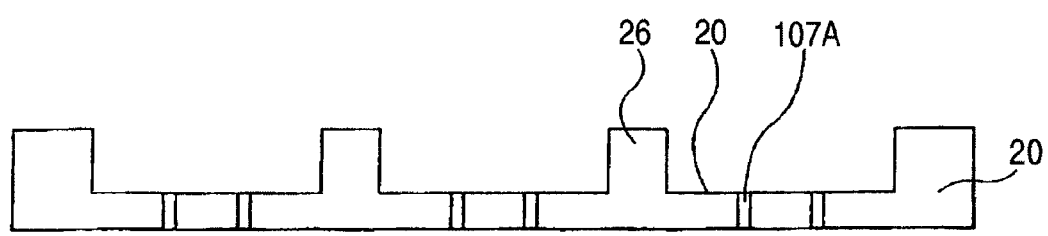
FIG. 4A is a view showing a method of fabricating the semiconductor device according to Embodiment 1 (part 1).

First, at a step shown in FIG. 4A, by etching to pattern the silicon board 20, the recessed portion 22 for installing the optical conversion element and the via hole 107A penetrating the silicon board 20 for forming the via plug 107 are formed.

Figure 4B:
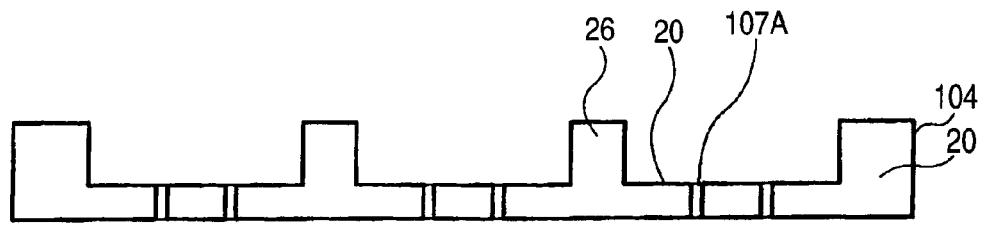
FIG. 4B is a view showing the method of fabricating the semiconductor device according to Embodiment 1 (part 2).

Next, at a step shown in FIG. 4B, the oxide film (there is also a case of being referred to as silicon oxide film, or thermally oxidized film) 104 is formed at the surface of the silicon board 20 including an inner wall face of the recessed portion 22 and an inner wall face of the via hole 107A by, for example, a thermal CVD (chemical vapor deposition) method or the like.

Figure 4C:
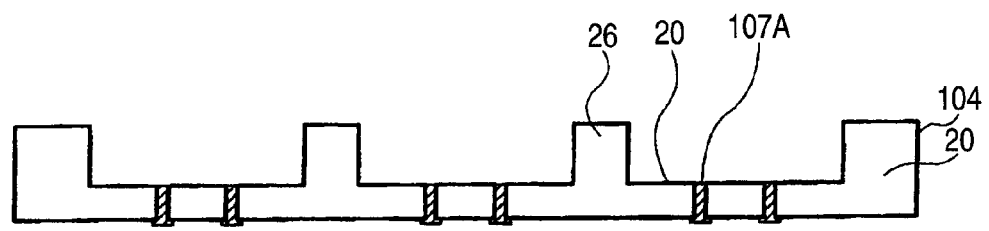
FIG. 4C is a view showing the method of fabricating the semiconductor device according to Embodiment 1 (part 3).

Next, at a step shown in FIG. 4C, the via holes 107A are respectively formed with the via plugs 107 by, for example, a method of plating Cu (for example, semiadditive method).

Figure 4D:
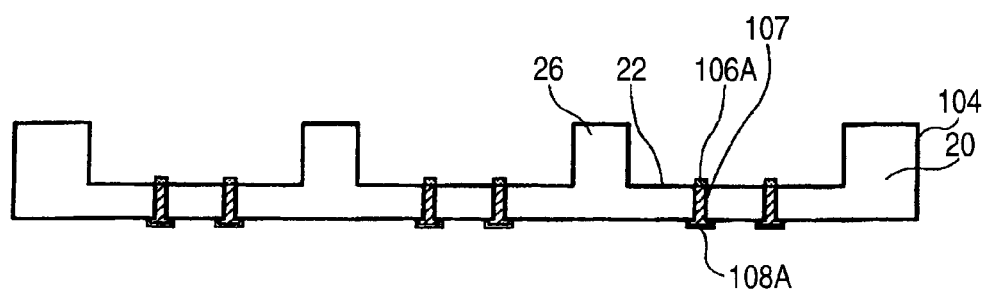
FIG. 4D is a view showing the method of fabricating the semiconductor device according to Embodiment 1 (part 4).

Next, at a step shown in FIG. 4D, connecting layers 106A, 108A including, for example, Ni/Au are formed by, for example, a plating method. In this case, the connecting layer 106A is formed on a side of the recessed portion 22 of the via plug 107, and the connecting layer 108A is formed on a side of the via plug 107 opposed to the recessed portion 22. Further, the connecting layers 106A, 108A are respectively laminated with Ni layers and Au layers such that bonding faces of being bonded with the bumps 106, 108 are constituted by the Au layers.

Figure 4E:
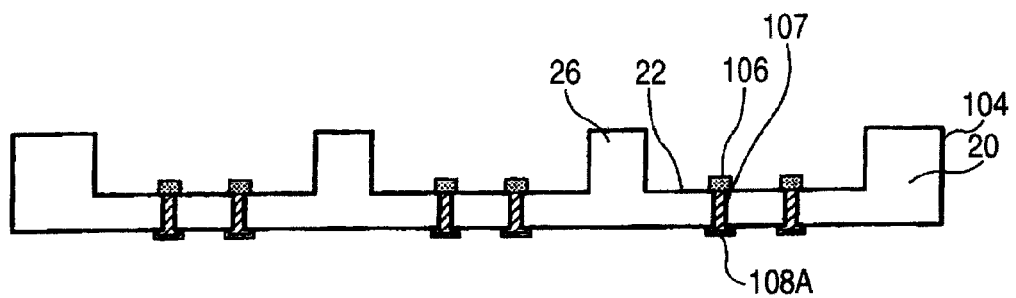
FIG. 4E is a view showing the method of fabricating the semiconductor device according to Embodiment 1 (part 5).

Next, at a step shown in FIG. 4E, the bumps (Au bumps) 106 are respectively formed on the connecting layers 106A. Further, illustration of the connecting layer 106A is omitted in the drawing and thereafter.

Figure 4F:
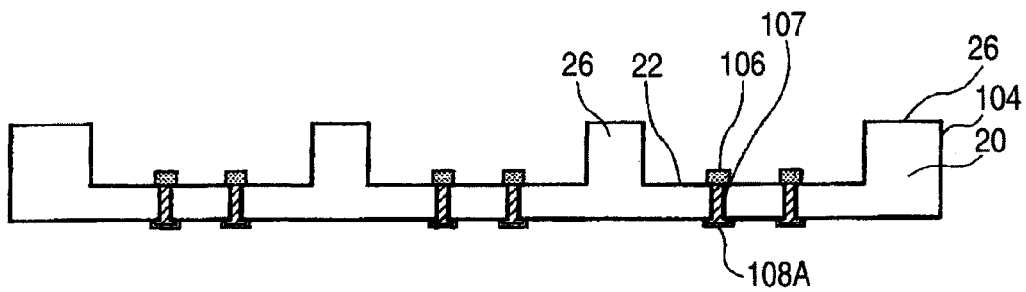
FIG. 4F is a view showing the method of fabricating the semiconductor device according to Embodiment 1 (part 6).

Next, at a step shown in FIG. 4F, the oxide film 104 at the surface of the wall portion 26 at the surrounding of the recessed portion 22 is exfoliated by, for example, mask etching. A portion of exfoliating the oxide film by the step is bonded with the glass plate 40 at a later step.

Figure 4G:
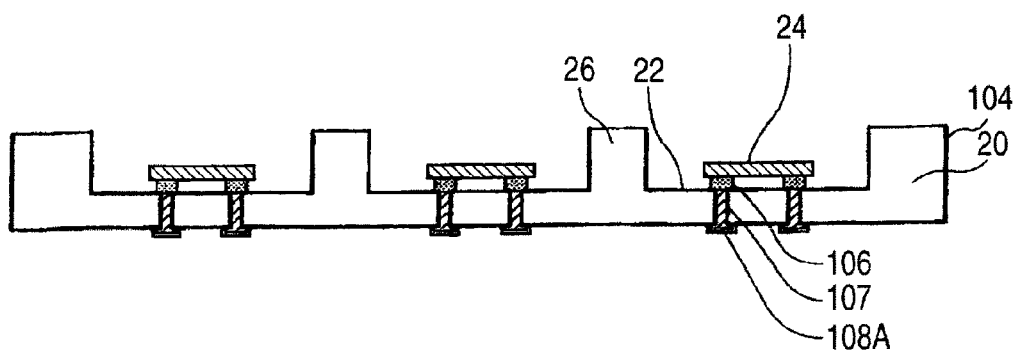
FIG. 4G is a view showing the method of fabricating the semiconductor device according to Embodiment 1 (part 7).

Next, at a step shown in FIG. 4G, for example, the optical conversion element 24 is installed at inside of the recessed portion 22. In this case, there is constructed a constitution in which the optical conversion element 24 and the bump 106 are electrically bonded by using, for example, thermal pressure welding or ultrasonic bonding to connect the optical conversion element 24 and the via plug 107 electrically by way of the bump 106.

Figure 4H:
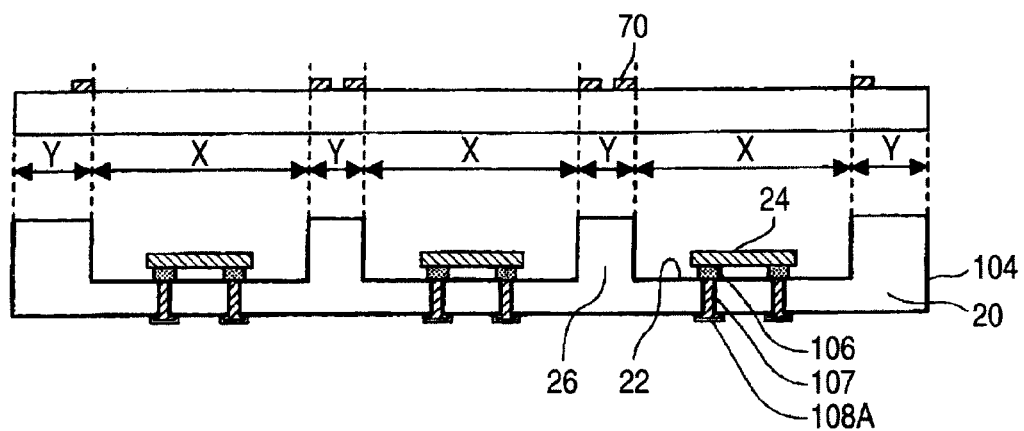
FIG. 4H is a view showing the method of fabricating the semiconductor device according to Embodiment 1 (part 8).

Next, at a step shown in FIG. 4H, the upper face (cathode side) of the glass plate 40 is formed with the voltage applying pattern 70 mentioned above. As a method of forming the voltage applying pattern 70, for example, a conductive metal of Cu or the like is laminated on the upper face of the glass plate 40 by using a thin film forming technology of a sputtering method, a CVD method or the like to form the voltage applying pattern 70. At this occasion, the voltage applying pattern 70 is formed by carrying out masking to constitute a square shape opposed to the upper face of the wall portion 26 surrounding the recessed portion 22 as shown by FIG. 2. Therefore, the voltage applying pattern 70 is formed in a shape along the bonding region Y surrounding the surrounding of the nonbonding region X opposed to the upper face of the optical conversion element 24 and the recessed portion 22 in FIG. 4H.

Further, a thickness of the voltage applying pattern 70 is set in accordance with a planer accuracy (magnitude of warp or waviness) of the upper face of the glass plate 40, and a conductive metal layer is laminated to constitute a thickness by which the upper face of the glass plate 40 and the cathode plate 50 are not brought into contact with each other in a state of bringing the cathode plate 50 into contact with the voltage applying pattern 70.

Figure 4I:
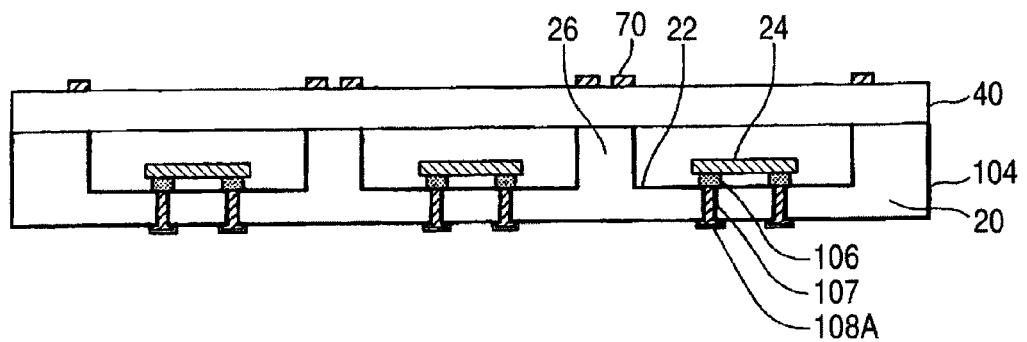
FIG. 4I is a view showing the method of fabricating the semiconductor device according to Embodiment 1 (part 9).

Next, at a step shown in FIG. 4I, the glass plate 40 is mounted above the silicon board 20. At the step, the mounting is carried out by positioning positions thereof relative to each other such the voltage applying pattern 70 formed on the glass plate 40 coincides (opposed) with the upper face of the wall portion 26 of the silicon board 20 in an up and down direction. Further, in the step, when the glass plate 40 is mounted above the silicon board 20, the glass plate 40 and the silicon board 20 may be adhered by using, for example, a tacking tape or the like having adherence such that the positions of the glass plate 40 and the silicon board 20 are not shifted from each other.

Figure 4J:
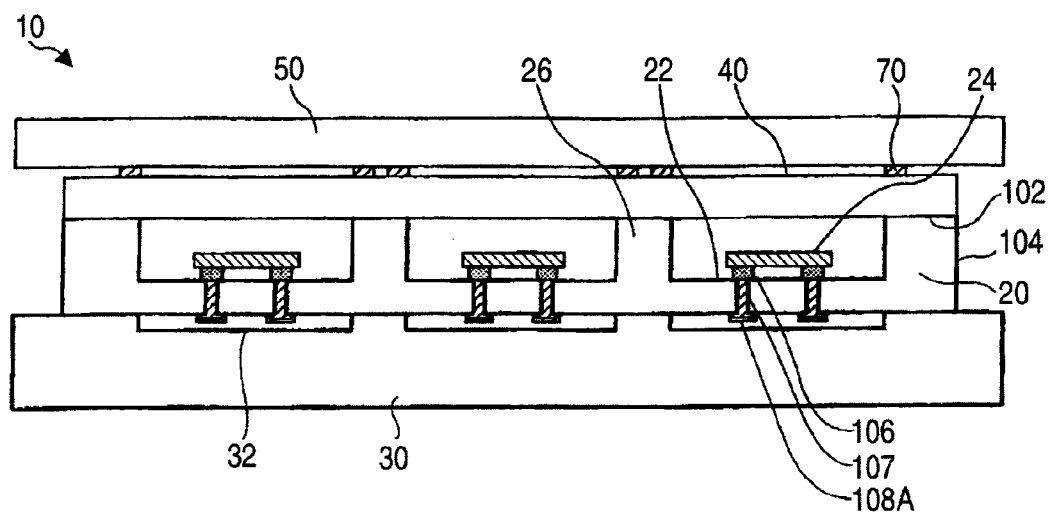
FIG. 4J is a view showing the method of fabricating the semiconductor device according to Embodiment 1 (part 10).

Next, at a step shown in FIG. 4J, the silicon board 20 is mounted on the anode plate 30 of the anodic bonding apparatus 10, and a high voltage is applied between the anode plate 30 and the cathode plate 50 in a state of bringing the cathode plate 50 of the anodic bonding apparatus 10 into contact with the voltage applying pattern 70 formed at the upper face of the glass plate 40. At this occasion, the cathode plate 50 is brought into a state of being separated from the upper face of the glass plate 40 by way of a small clearance by being brought into contact with the voltage applying pattern 70.

Further, the upper face of the anode plate 30 is formed with a recessed portion 32 so as not to be brought into contact with the connecting layer 108A projected from the lower face of the silicon board 20. Therefore, the anode plate 30 is formed with the recessed portion 32 at a region thereof to which the lower face of the optical conversion element 24 is opposed, and the upper face surrounding the recessed portion 32 is brought into contact with the lower face of the silicon board 20.

The voltage is applied to the glass plate 40 by way of the voltage applying pattern 70, and therefore, the glass plate 40 is brought into a state of heating the bonding region Y opposed to the voltage applying pattern 70, and is bonded to the upper face of the wall portion 26 of the silicon board 20. Therefore, an impurity (sodium) is prevented from being precipitated to the nonbonding region X to which the recessed portion 22 and the optical conversion element 24 are opposed. Thereby, the glass plate 40 is bonded such that a reduction in transmittance of the nonbonding region X to which the optical conversion element 24 is opposed is not brought about, and the optical conversion element 24 is not hampered from receiving light or emitting light.

When the anodic bonding is carried out, Si constituting the silicon board 20 and oxygen at inside of the glass plate 40 are bonded to carry out stable bonding having an excellent bonding force. Further, in the anodic bonding, different from bonding using a resin material, a gas, an impurity or the like for contaminating the inner space of the recessed portion 22 sealed with the optical conversion element 24 is hardly generated.

Figure 4K:
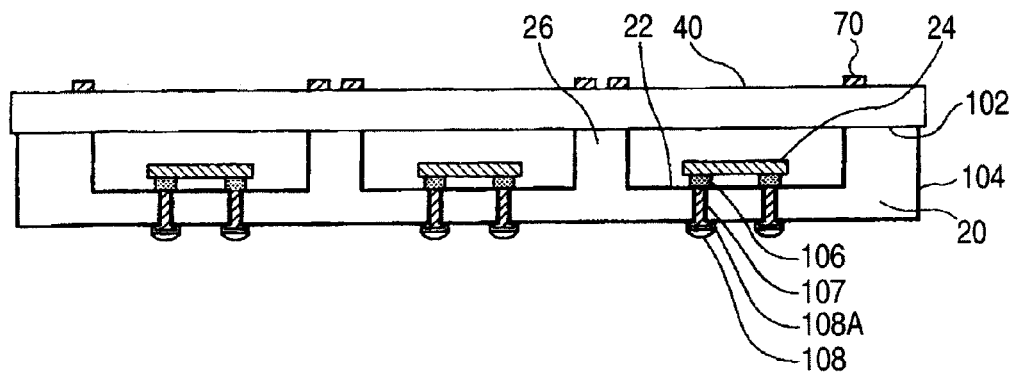
FIG. 4K is a view showing the method of fabricating the semiconductor device according to Embodiment 1 (part 11).

Next, at a step shown in FIG. 4K, the bonding layers 108A are respectively formed with the solder bumps 108. Further, in the step shown in FIG. 4K, the voltage applying pattern 70 formed at the glass plate 40 may be removed by etching. Further, in the step, the connecting layer 108A per se may be used as an external connecting terminal without providing the solder bump 108.

Figure 4L:
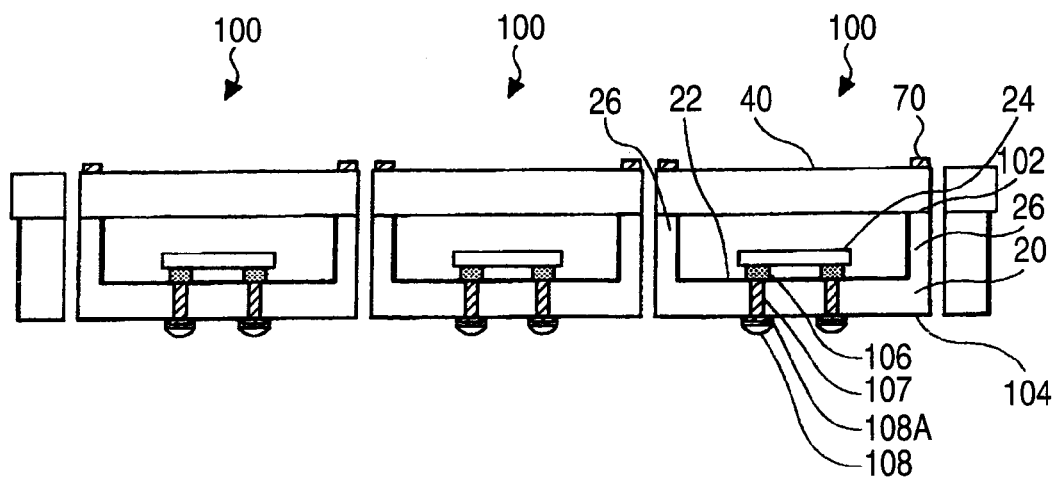
FIG. 4L is a view showing the method of fabricating the semiconductor device according to Embodiment 1 (part 12).

Next, at a step shown in FIG. 4L, the semiconductor device 100 explained above can be provided by cutting to fragment the sealed structure 60 integrated by the anodic bonding along the scribe line 80 by dicing. Although the semiconductor device 100 fragmented by the cutting step is brought into a state in which the voltage applying pattern 70 remains at the upper face of the glass plate 40, the voltage applying pattern 70 may remain as it is since the voltage applying pattern 70 is disposed at a position of not hampering the optical conversion element 24 from emitting light and receiving light. Or, the voltage applying pattern 70 may be utilized as an identification mark for identifying that the anodic bonding is carried out when the semiconductor device 100 is mounted to a mother board or the like.

Further, by narrowly forming a width of the voltage applying pattern 70, the voltage applying pattern 70 can be formed along the scribe line 80. In this case, in cutting by the dicing step, also the voltage applying pattern 70 can be deleted, and when the voltage applying pattern 70 needs to be exfoliated, an exfoliating step can be dispensed with.

Embodiment 2

Figure 5:
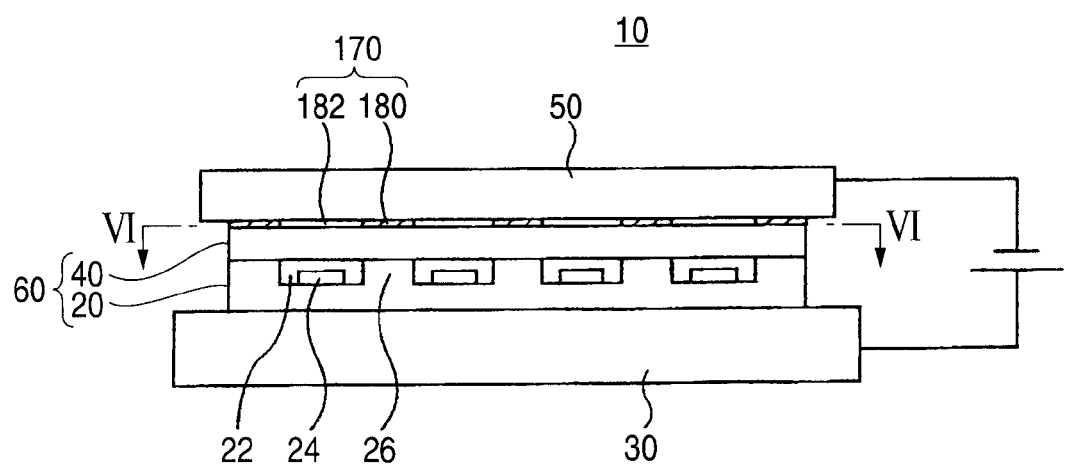
FIG. 5 is a vertical sectional view schematically showing an anodic bonding apparatus for bonding a sealed structure according Embodiment 2 of the invention.
Figure 6:
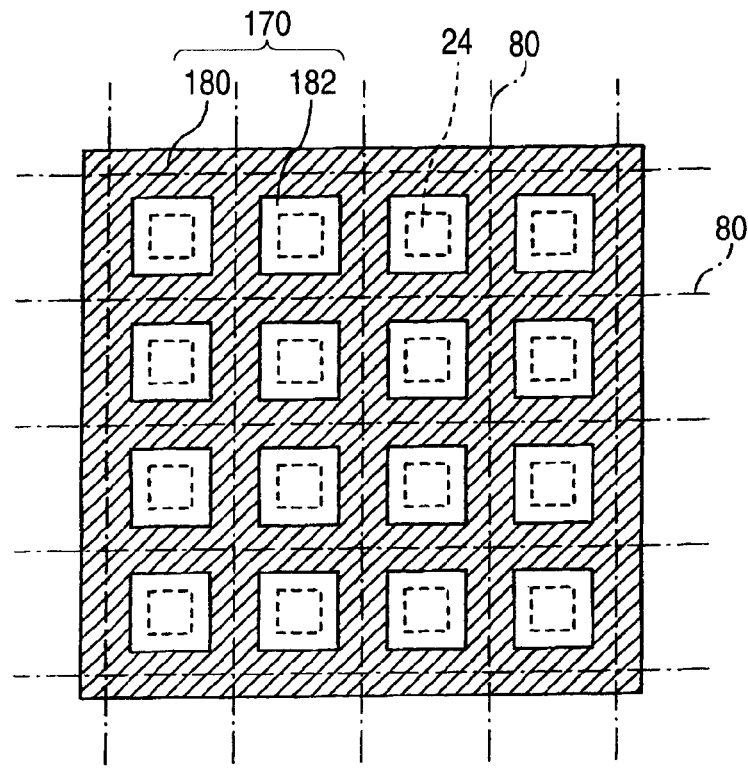
FIG. 6 is a cross-sectional view taken along a line VI-VI of FIG. 5.

FIG. 5 is a vertical sectional view schematically showing an anodic bonding apparatus for bonding a sealed structure according to Embodiment 2 of the invention. FIG. 6 is a cross-sectional view taken along a line VI-VI of FIG. 5. Further, in FIG. 5 and FIG. 6, portions the same as those of Embodiment 1 are attached with the same notations and an explanation thereof will be omitted.

As shown by FIG. 5, a voltage applying pattern 170 is formed between the upper face of the glass plate 40 and an cathode plate 50. As shown by FIG. 6, the voltage applying pattern 170 is formed in a shape of a lattice (portion in FIG. 6 shown by hatching) along a region surrounding a surrounding of a nonbonding region to which the recessed portion 22 is opposed.

As a method of forming the voltage applying pattern 170, first, a conductive metal layer 180 having a uniform thickness is formed by laminating a conducting metal of Cu or the like on a total of the upper face (the same plane) of the glass plate 40 by using a plating method. Next, a through hole 182 penetrated in an up and down direction is formed by removing a noncontact region of the conductive metal layer 180 to which the recessed portion 22 is opposed by mask etching.

Thereby, the voltage applying pattern 170 formed by the conductive metal layer 180 having the through hole 182 is provided.

The voltage applying pattern 170 is formed not to be disposed above the optical conversion element 24 and is formed to surround a light transmitting region to which the optical conversion element 24 is opposed. Further, the voltage applying pattern 170 functions as a cathode pattern applied with a voltage by being brought into contact with the lower face of the cathode plate 50. Therefore, when the high voltage is applied to the voltage applying pattern 170, although the impurity (sodium) included in the glass plate 40 is precipitated to the cathode side (bonding portion) of the glass plate 40 in the bonding region to which the voltage applying pattern 170 is opposed, the impurity (sodium) in the nonbonding region (light transmitting region) to which the recessed portion 22 is opposed is prevented from being precipitated.

Embodiment 3

Figure 7:
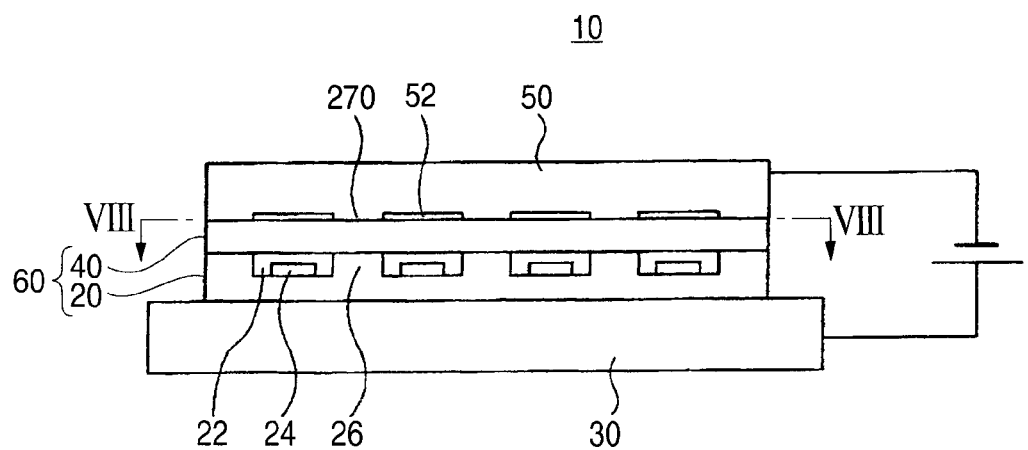
FIG. 7 is a vertical sectional view schematically showing an anodic bonding apparatus for bonding a sealed structure according Embodiment 3 of the invention.
Figure 8:
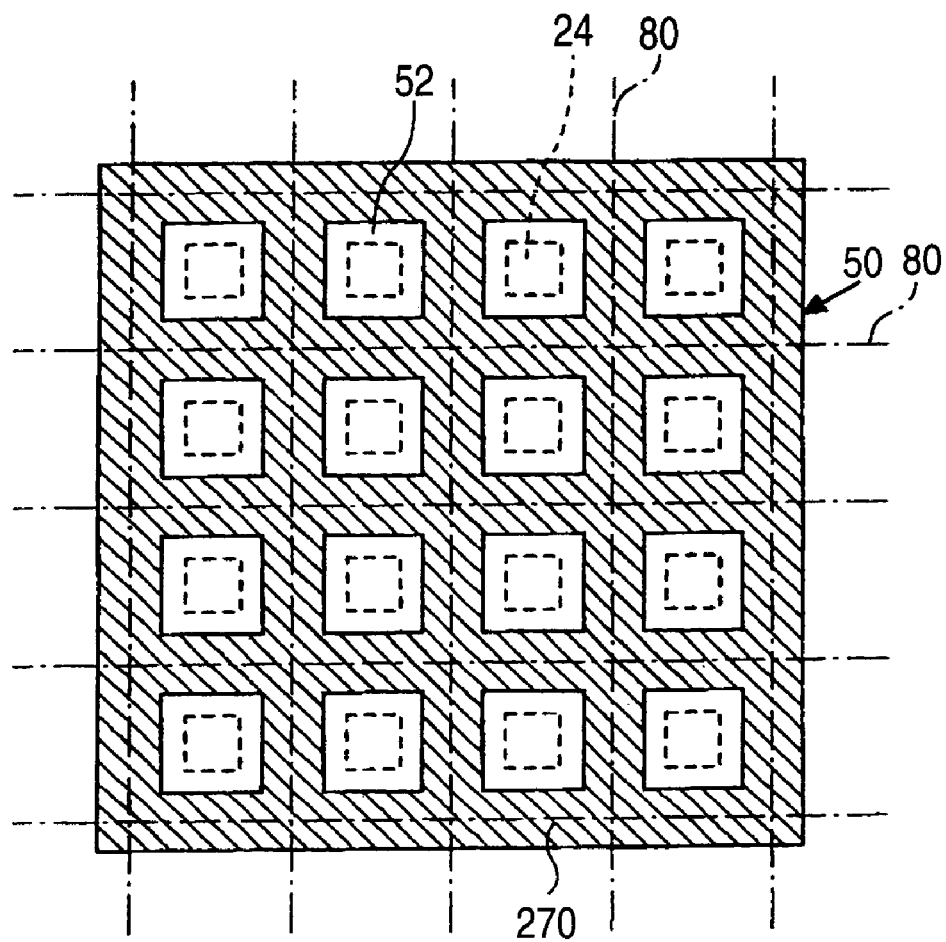
FIG. 8 is a cross-sectional view taken along a line VIII-VIII of FIG. 5.

FIG. 7 is a vertical sectional view schematically showing an anodic bonding apparatus for bonding a sealed structure according to Embodiment 3 of the invention. FIG. 8 is a cross-sectional view taken along a line VIII-VIII of FIG. 7. Further, in FIG. 7 and FIG. 8, portions the same as those of Embodiment 1 are attached with the same notations and an explanation thereof will be omitted.

As shown by FIG. 7, a voltage applying pattern 270 is formed between the upper face of the glass plate 40 and the cathode plate 50. As shown by FIG. 8, the voltage applying pattern 270 is formed at the lower face of the cathode plate 50, and is formed in a shape of a lattice (portion of FIG. 8 shown by hatching) along a region surrounding a surrounding of a nonbonding region (light transmitting region) to which the recessed portion 22 is opposed.

The voltage applying pattern 270 can be formed by providing an escape portion 52 as a noncontact portion at a region of the surface of the cathode plate 50 opposed to the nonbonding region. Therefore, by arranging the escape portion 52 at a position of being opposed to the recessed portion 22, the lower face of the cathode plate 50 is formed with the voltage applying pattern 270 along a bonding region surrounding the surrounding of the nonbonding region (light transmitting region).

Further, when the high voltage is applied to the voltage applying pattern 270 in a state of bringing the voltage applying pattern 270 formed at the lower face of the cathode plate 50 into contact with the upper face of the glass plate 40, although the impurity (sodium) included in the glass plate 40 is precipitated on the cathode side (bonded portion) of the glass plate 40 in the bonding region opposed to the voltage applying pattern 270, the impurity (sodium) in the nonbonding region (light transmitting region) to which the recessed portion 22 is opposed is prevented from being precipitated.

According to the embodiment, since the lower face of the cathode plate 50 is integrally formed with the voltage applying pattern 270, a step of forming the voltage applying pattern at the glass plate 40 as in the above-described embodiment can be omitted, the voltage applying pattern does not remain also in the finished semiconductor device, and therefore, also a step of removing the voltage applying pattern can also be omitted.

Although an explanation is given of the invention with regard to the preferable embodiments as described above, the invention is not limited to the above-described specific embodiments but can variously be modified or changed within the gist described in the scope of claims.

Embodiment 4

Figure 9:
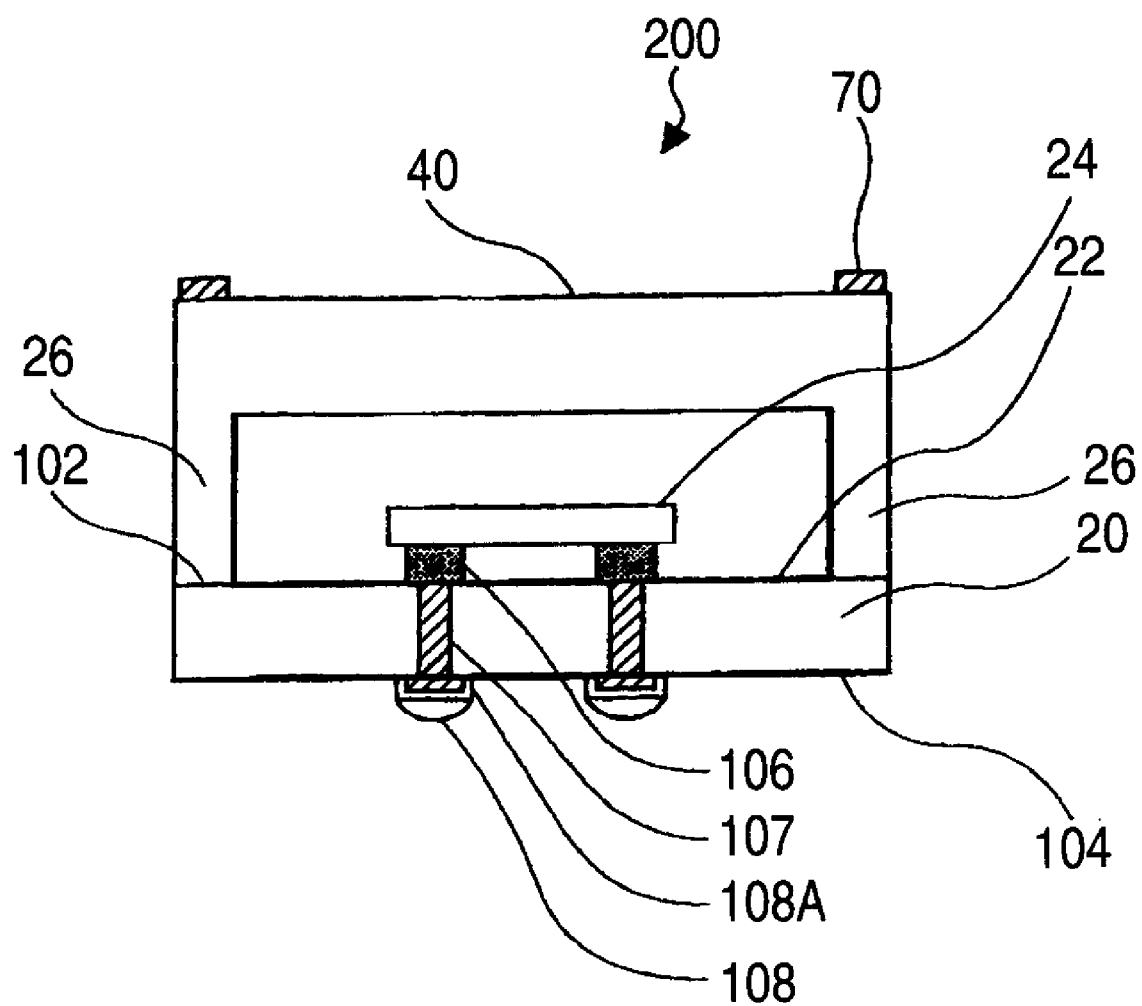
FIG. 9 is a view showing a semiconductor device having a sealed structure according to Embodiment 4.

FIG. 9 is a view showing a semiconductor device having a sealed structure according to Embodiment 4. Further, portions of FIG. 9 the same as those of FIG. 3 are attached with the same notations and an explanation thereof will be omitted.

As shown by FIG. 9, a semiconductor device 200 is constructed by a constitution of including the silicon board 20 formed in a shape of a flat plate, the glass plate 40 formed with the recessed portion 22 on a side of a lower face thereof, and the optical conversion element 24 contained at inside of the recessed portion 22 of the glass plate 40 in a state of being mounted on the silicon board 20, and sealing the recessed portion 22 in an airtight state by anodically bonding the lower face of the wall portion 26 surrounding the recessed portion 22 provided at the glass plate 40 and the upper face of the silicon board 20. Further, a bonding layer 102 is constituted by a portion of bringing the lower face of the wall portion 26 provided at the glass plate 40 and the upper face of the silicon board 20 into contact with each other.

Also in the case of Embodiment 4, similar to the above-described embodiments, the anodic bonding apparatus 10 (refer to FIG. 1, FIG. 5, FIG. 7) anodically bonds the upper face of the silicon board 20 and the lower face of the glass plate 40 by applying the high voltage in the state of bringing the anode plate 30 into contact with the lower face of the silicon board 20 and bringing the cathode plate 50 into contact with the upper face of the transparent glass plate 40.

Therefore, the bonding layer 102 is anodically bonded by the anodic bonding apparatus 10 by way of the voltage applying pattern 70, 170, 270. According to the embodiment, the recessed portion 22 is formed at the lower face of the glass plate 40, and therefore, also the wall portion 26 surrounding the recessed portion 22 is formed by glass. Therefore, the optical conversion element 24 mounted at inside of the recessed portion 22 sealed by anodic bonding can emit or receive light transmitting through the wall portion 26 surrounding a side face thereof.

In this way, although according to Embodiments 1 through 3, there is pointed out the example of the constitution of forming the recessed portion 22 at the silicon board 20 and mounting the optical conversion element 24 to the recessed portion 22, according to the embodiment, the fabricating method of the invention is applicable also to a semiconductor device 200 including a sealed structure constructed by a constitution of forming the silicon board 20 in the shape of the flat plate, forming the recessed portion 22 at the lower face of the glass plate 40, and sealing the optical conversion element 24 mounted above the silicon board 20 by the recessed portion 22 of the glass plate 40.

Embodiment 5

Figure 10:
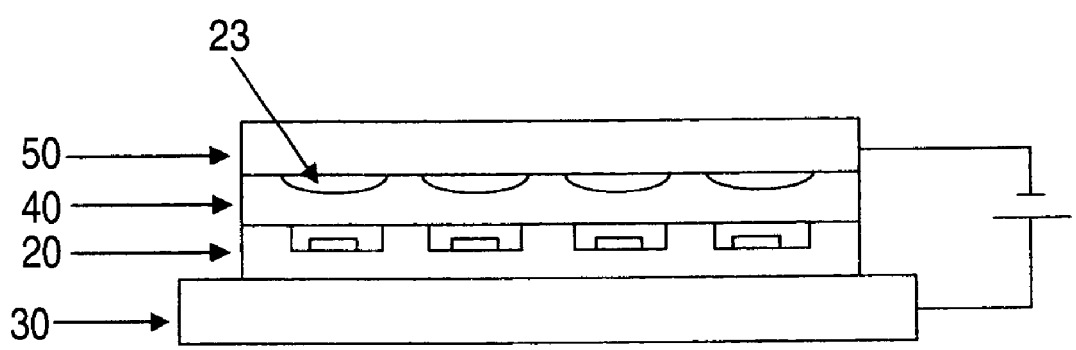
FIG. 10 is a view showing a semiconductor device having a sealed structure according to Embodiment 5.

As shown in FIG. 10, by providing depressions 23 on the surface of the glass plate 40, it is possible that the contact portions between the glass plate 40 and the cathode plate 50 are used as a voltage applying patterns 70.

Further, although an explanation is given by pointing out the example of the sealed structure and the semiconductor device having the constitution of mounting the optical conversion element 24 at the recessed portion 22 of the silicon board 20 and sealing the recessed portion 22 by the glass plate 40, the invention is not limited thereto but the invention is naturally applicable without constructing the constitution as in the embodiment so far as the invention is constituted by a sealed structure for bonding by using anodic bonding.

What is claimed is:
1. A sealed structure comprising:
a silicon board,
glass plate to be anodically bonded to the silicon board,
anode plate in contact with the silicon board,
a cathode plate in contact with the glass plate, wherein a recessed portion is provided at either the silicon board or the glass plate to be sealed, a voltage applying pattern surrounding a nonbonding region to which the recessed portion is opposed is formed along a bonding region between the glass plate and the cathode plate, and a wall portion surrounding the recessed portion is anodically bonded to the glass plate or the silicon board by applying a high voltage to the voltage applying pattern.

2. A semiconductor device, comprising:

a recessed portion provided at either a silicon board or a glass plate to be bonded to the silicon board, an element mounted at inside of the recessed portion, an anode plate in contact with the silicon board, a cathode plate in contact with the glass plate, wherein the silicon board and the glass plate are anodically bonded to seal the recessed portion, a voltage applying pattern surrounding a light transmitting region to which the element is opposed is formed along a region between the glass plate and the cathode plate, and a wall portion surrounding the recessed portion is anodically bonded to the glass plate or the silicon board by applying a high voltage to the voltage applying pattern.

3. The sealed structure according to claim 1, wherein depressions are provided on the surface of the glass plate opposed to the recessed portion.

4. The semiconductor device according to claim 2, wherein depressions are provided on the surface of the glass plate opposed to the light transmitting region.

5. The sealed structure according to claim 1, wherein the voltage applying pattern includes a conductive metal layer having a through hole opposed to the recessed portion.

6. The sealed structure according to claim 1, wherein the voltage applying pattern includes a noncontact portion at a region of a surface of the cathode plate opposed to the nonbonding region.

7. The semiconductor device according to claim 2, wherein the voltage applying pattern includes a conductive metal layer having a through hole opposed to the element.

8. The semiconductor device according to claim 2, wherein the voltage applying pattern includes a noncontact portion at a region of a surface of the cathode plate opposed to the light transmitting region.

* * * * *